United States Patent [19]

Seeger et al.

[11] 4,099,103

[45] Jul. 4, 1978

[54] APPARATUS FOR CONTROLLING THE ROTORS OF SYNCHRONOUS MOTORS

[75] Inventors: Arnold Seeger, Herzogenrath; Wilfried Schalt, Jülich, both of Germany

[73] Assignee: Kernforschungsanlage Jülich GmbH, Jülich, of Germany

[21] Appl. No.: 729,875

[22] Filed: Oct. 5, 1976

[51] Int. Cl.² .............................................. H02P 7/36
[52] U.S. Cl. ...................................... 318/85; 318/175; 318/625
[58] Field of Search ................... 318/167, 175, 85, 70, 318/78, 41, 44, 59, 313, 314, 318, 625

[56] References Cited

U.S. PATENT DOCUMENTS

| | | | |
|---|---|---|---|
| 3,675,098 | 7/1972 | Heiberger | 318/85 |
| 3,694,716 | 9/1972 | Eland | 318/175 |
| 3,803,464 | 4/1974 | Kuroyanagi | 318/85 |
| 3,833,843 | 9/1974 | Bossons | 318/314 X |
| 3,997,828 | 12/1976 | Bottcher et al. | 318/85 X |

*Primary Examiner*—B. Dobeck
*Attorney, Agent, or Firm*—Karl F. Ross

[57] ABSTRACT

A device for measuring the angular position of the rotor of a synchronous motor relative to the rotating field thereof wherein the synchronous motor is driven by a frequency generator. The synchronous motor has an optoelectronic device generating a pulse for each rotation of the rotor and applied to the stop input of a counter whose start input receives from a frequency divider connected to the frequency generator and having a dividing factor equal to the number of poles of the synchronous motor. A frequency multiplier is also connected to the frequency generator and the output of the multiplier is applied to the counting-pulse input of the counter. The count registered on the counter in the interval between start and stop pulses is thus proportional to the lag of the rotor behind the rotating field.

6 Claims, 2 Drawing Figures

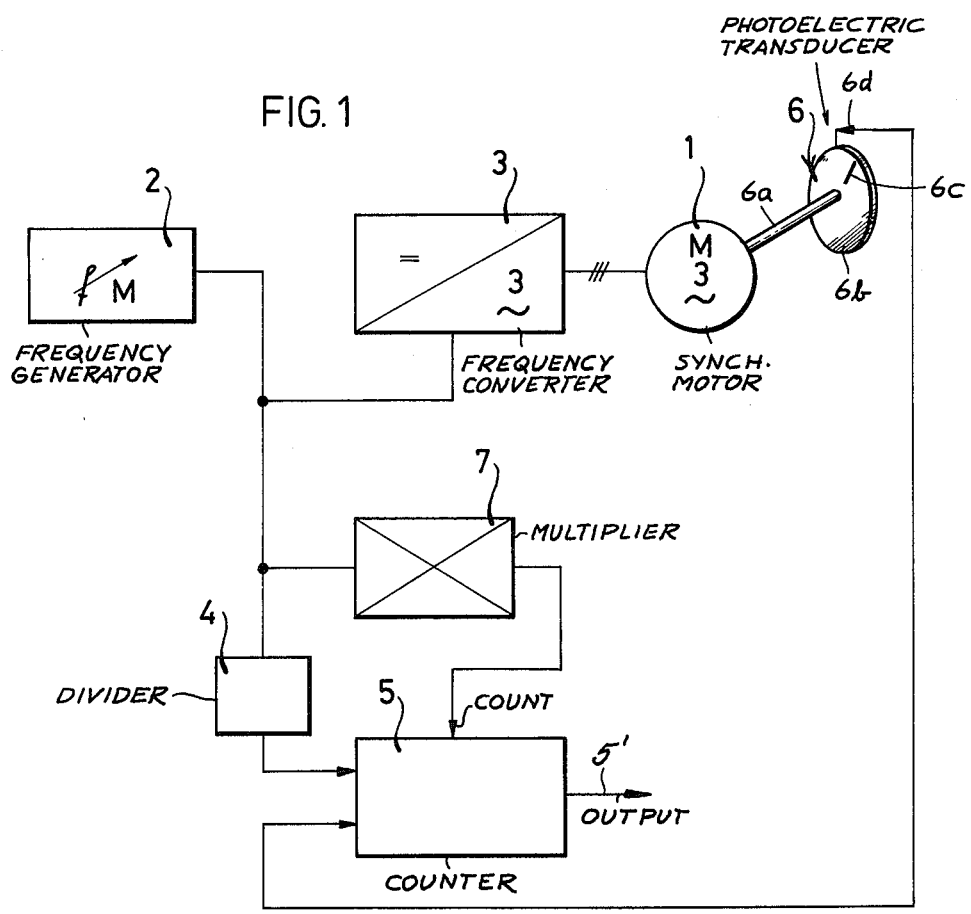

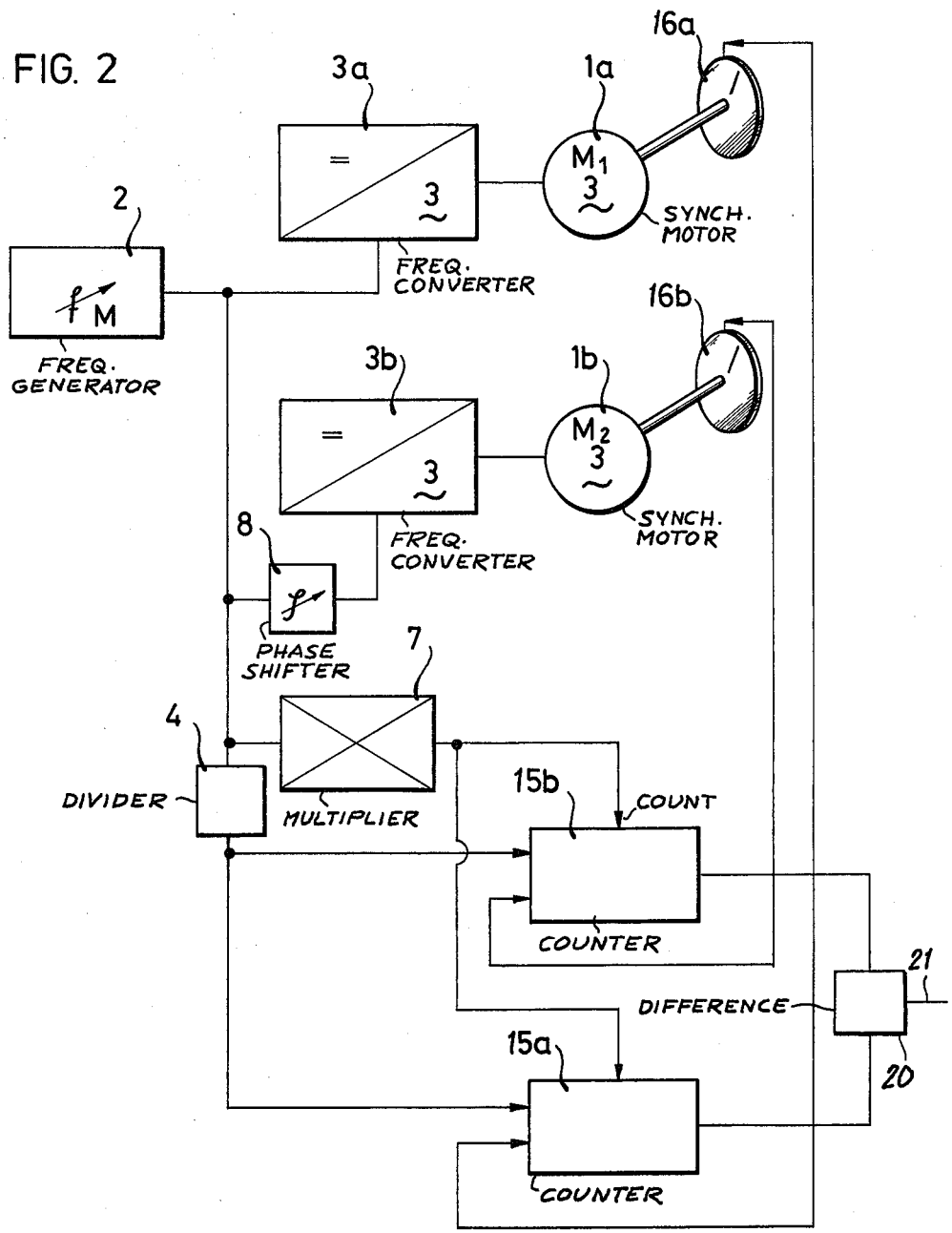

APPARATUS FOR CONTROLLING THE ROTORS OF SYNCHRONOUS MOTORS

CROSS-REFERENCE TO RELATED APPLICATION

The present application is related to our concurrently filed, commonly assigned and copending application Ser. No. 729,877.

FIELD OF THE INVENTION

The present invention relates to a device for determining the angular position of the rotor of a synchronous motor with respect to the phase position of the rotating field driving the synchronous motor and, more particularly, to a system for monitoring the operation of a synchronous motor especially for use in a chopper or the like in neutron spectrometry.

BACKGROUND OF THE INVENTION

Neutron spectrometry can involve the generation of a polychromatic beam of neutrons which are characterized by different velocities and hence energies, these velocities and energies being associated with respective frequencies.

Gnerally a monoenergetic beam of neutrons is desired and it is thus a common practice to subject the polychromatic beams to a form of filtration or monochromatization, selecting the neutrons of a single energy, velocity or frequency from the polychromatic beam.

The monochromatic beam can be used for the investigation of solid matter by neutron scattering or for activation of a substance or for investigations of the dynamic behavior of atoms. In all of these cases a so-called monochromatic or monoenergetic beam of neutrons is more desirable than the "white" or polychromatic beams produced by simple collimation of the output of a neutron generator, e.g. a nuclear reactor or pile.

The coarse monochromatization or energy-separation of the polychromatic beam of neutrons is generally carried out by drum separators. Such separators provide a rough separation of the beams so that the beam passing the separator is monoenergetic within certain limits. Such devices are also known as energy or velocity selectors. In a typical energy or velocity selector of the drum type, the drum consists of neutron absorbing material and is provided with axial and helical grooves such that only neutrons within a specific velocity range can pass, all others being absorbed on the drum.

To eliminate harmonics, disk choppers are provided, the choppers having disks of neutron-absorbing material and provided with windows through which the neutrons can pass. The drums and disks can be arranged in succession and, of course, the more disks, drums and the like provided along the neutron path, the greater will be the resolution and hence the energy band width of the beam reaching its ultimate destination or target. This increased "definition" is found to be in the form of lines of distinct wavelength and hence a limited spread of the energy spectrum of the beam reaching the target etc.

In the present application, the term "frequency" when referring to a neutron beam will be understood to be the reciprocal of the wavelength $\lambda$ where $\lambda = h/mv = (h/p)$. In this relationship $h$ is Planck's constant, $p$ is the momentum of the neutron, $m$ is the neutron mass and $v$ the neutron velocity. The neutron energy can be determined by the Einstein relationship from the mass and velocity.

In such choppers and other components of time-of-flight neutron spectrometers, it is desirable to provide a system for determining the angular position of the rotor of a synchronous motor relative to the phase position of the rotary field driving the synchronous motor.

Such devices or systems are advantageous, for example, for the measurement of the load angle of a synchronous motor either purely for the purpose of measurement (e.g. to permit plotting of the load-angle characteristic) or for using the measured value of the load angle as the input parameter (instantaneous value) for a control circuit regulating the operation of the motor.

In time-of-flight neutron spectrometers it is important to establish the rotation angle of the rotor relative to the input frequency of the frequency generator energizing the motor (i.e., the degree to which the rotor may be lagging the position determined by the applied frequency) or to measure relative angular positions of the rotors of several synchronous motors.

It is known to determine the angular position of the pole rotor of a synchronous motor by means of a stroboscope triggered at the frequency of the frequency generator or transmitter. It is disadvantageous with such systems that the measurement can only be read optically and is not represented by an electronic signal that can be used as an input for control or other purposes.

It has also been proposed to provide a pulse-counting circuit with automatic start-stop means and associated with an optoelectronic device. The pulse counter is triggered by a pulse from the frequency generator or transmitter and it is stopped by a further pulse from the optoelectronic device when a zero mark carried by the magnetic-pole rotor is aligned therewith.

The pulse count obtained within the time interval between the start and the stop pulse is stored in the counter. The count pulses are produced by the optoelectronic device from subdivision traces or marks carried by the rotor. The disadvantage of this arrangement is that precision of the measurement is limited by the low resolution capacity of an optoelectronic device when the rotor is driven at high speed.

OBJECTS OF THE INVENTION

It is an object of the invention to provide a system for determining the angular position of the magnetic pole rotor of a synchronous motor relative to the phase position of the rotating field driving the motor independently of the angular velocity of the synchronous motor.

It is another object of the invention to provide an improved system of this class which gives high precision even when the motor is operated at high speed.

Yet another object of the invention is to provide a relatively simple system of this type which yields a measurement in the form of an electric or electronic signal which can be used as an input parameter for a conrol circuit or the like.

SUMMARY OF THE INVENTION

These objects and others which will become apparent hereinafter are attained according to the present invention by providing a frequency divider connected to the frequency transmitter or generator to divide the frequency of the generator by the number of poles of the magnet pole rotor of the synchronous motor, starting a counter with the first pulse of the divider pulse train, and stopping the counter with a stop pulse produced by an optoelectronic device responsive to a zero position of the rotor. The system also comprises a frequency multiplier whose output provides a corresponding number of pulses for storage in the counter between the start and stop pulses mentioned above. The registered counts are thus proportional to the degree to which the rotor lags behind the position of the rotating field and hence to the angular position of the rotor relative to the rotating field.

Thus the count is commenced in response to the frequency generated through the frequency divider and represents the phase position of the rotating field. The counter stops when the rotor reached its zero position. In this intervening time interval the output of the multiplier is counted. Since the latter number of pulses is proportional to the frequency of the frequency generator and inversely porportional to the speed of the motor, the result of the count for equal angles of the rotor is independent of the speed of the synchronous motor and is always equal. Since the multiplication factor can be selected at will, the results can be extremely precise even at high speeds.

According to another aspect of the invention, for two synchronous motors driven by the same frequency generator, the relative angular positions are determined by respective counters and the angular positions vis-a-vis one another by a further counter which registers the difference in the counts of the pulse trains of the individual motors. This difference can also be represented by an electronic or electric signal which can be used for control or other purposes. With this embodiment of the invention the relative angular positions of the pole rotors of two synchronously driven motors can be determined with high precision independent of the speed of the motors.

If, of course, a predetermined angular offset is desired between the two rotors, the circuit for energizing one of the synchronous motors includes a phase shifter.

BRIEF DESCRIPTION OF THE DRAWING

The above and other objects, features and advantages of the present invention will become more readily apparent from the following description, reference being made to the accompanying drawing in which:

FIG. 1 is a block diagram of a system according to the invention for a single synchronous motor; and FIG. 2 is a block diagram of the system using two synchronously driven synchronous motors.

SPECIFIC DESCRIPTION

FIG. 1 shows a synchronous motor operated by a frequency generator 2 through a frequency converter 3 transforming the frequency-generator signal into the corresponding three-phase output for operating the three-phase motor. A frequency divider 4 is provided between the frequency generator 2 and the start input of a pulse counter 5. The frequency divider has a division factor (divisor) equal to the number of magnet poles of the motor 1.

When the motor 1 is a six-pole synchronous motor, the dividing factor of the divider 4 is six and the number of pulses applied to the start input of the counter 5 is 1/6th of the number of pulses arising at the frequency generator.

Thus the number of pulses applied to the set or start input of the counter 5 corresponds to the number of revolutions of the rotating field.

The synchronous motor 1 also is provided with an optoelectronic device 6 providing a pulse to the counter 5 once each revolution of the rotor. To this end the rotor has a shaft 6a with a disk 6b carrying a mark or trace 6c representing the null or zero position and scanned by a photosensitive element 6d forming an optoelectronic transducer.

The count input of the counter 5 receives pulses from a multiplier 7 connected to the output of the frequency generator 2. The multiplier is designed to provide a high pulse count (e.g. 6000 per revolution of the motor) in the time interval between start and stop pulses. Preferably the multiplier 7 is of the phase-locked loop type.

The counter 5 can have an electronic output 5' which can be used to regulate the motor speed as a function of the load moment represented by the angular lag (proportional to the registered count) of the rotor behind the rotating field.

FIG. 2 illustrates a system in which two synchronously driven synchronous motors 1a and 1b are operated from a common frequency generator 2 of the type described.

In this embodiment, each motor is provided with a frequency converter 3a, 3b and has an optoelectronic device 16a, 16b as previously described for the device 6. The motor 1b can be driven with a phase shift relative to the motor 1a by providing a phase shifter 8 between the frequency generator 2 and the frequency converter 3b.

The output of the frequency generator 2 is applied to a divider 4 and is fed by the divider to the start inputs of respective counters 15a and 15b whose stop inputs are energized via the optoelectronic devices 16b and 16a respectively. The outputs of the counters 15a and 15b are fed to a difference counter 20 which registers the difference. A difference signal may be derived at 21 for use in controlling the motors or for any other purpose which may be desired.

The system described is particularly useful in time-of-flight spectrometers as previously described. In both of the embodiments, the counter specific to the motor registers a count which is proportional to the phase lag between the respective rotor and its rotating field. The difference counter 20, of course, registers a count representing the angular difference between the positions of the two rotors.

We claim:

1. A system for measuring the angular position of a rotor of a synchronous motor relative to the rotating field thereof, said system comprising:
    a frequency generator energizing said motor;
    a frequency divider connected to said frequency generator;
    a counter having a count-starting input, a count-stopping input and a countable-pulse input, said count-starting input being connected to said divider, said divider having a divider factor equal to the number of poles of the motor;
    an optoelectronic device responsive to rotation of the rotor and generating a pulse upon each rotation of the device, said optoelectronic device being connected to the count-stopping input of said counter whereby the interval between starting and stopping of the counter registers pulses therein; and
    a frequency multiplier connected to said frequency generator and having its output connected to the countable-pulse input of said counter for registry of pulses from said multiplier during said interval.

2. The system defined in claim 1 wherein a second synchronous motor having a rotor is energized by said frequency generator, said system also comprising:

a second counter having a start input, a stop input and a pulse input, said second motor being provided with a second optoelectronic device generating a pulse upon each rotation of the rotor of said second motor, said second optoelectronic device being connected to the stop input of said second counter, said start input of said second counter being connected to said frequency divider.

3. The device defined in claim 2, further comprising a difference counter connected to the first mentioned counter and to said second counter for registering the difference in counts therebetween.

4. The device defined in claim 3 wherein said difference counter has an electronic-signal output carrying an electronic signal corresponding to the count registered therein.

5. The device defined in claim 2 wherein each of said counters has an electronic output representing the count registered therein.

6. The device defined in claim 1 wherein said counter has an electronic output corresponding to the count registered therein.

* * * * *